United States Patent [19]

Sholander et al.

[11] Patent Number: 5,655,135
[45] Date of Patent: Aug. 5, 1997

[54] SYSTEM FOR WRITE PROTECTING A BIT THAT IS HARDWARE MODIFIED DURING A READ-MODIFY-WRITE CYCLE

[75] Inventors: Kevin A. Sholander, Albuquerque, N. Mex.; Neil E. Birns, Milpitas, Calif.; Farrell L. Ostler, Albuquerque, N. Mex.; Gregory K. Goodhue; Santanu Roy, both of San Jose, Calif.

[73] Assignee: Philips Electronics North America Corporation, New York, N.Y.

[21] Appl. No.: 308,059

[22] Filed: Sep. 16, 1994

[51] Int. Cl.[6] ................................................ G06F 15/00
[52] U.S. Cl. .................. 395/427; 395/469; 395/470; 395/471; 395/472; 395/869; 395/507; 395/515; 364/247.3; 364/252.5; 364/259.7; 364/DIG. 1
[58] Field of Search ........................... 395/800, 162, 395/164, 165, 166, 869, 469, 470, 471, 472; 364/DIG. 1, 247.3, 252.5, 259.7

[56] References Cited

U.S. PATENT DOCUMENTS

| | | | |
|---|---|---|---|
| 4,958,378 | 9/1990 | Bell | 382/34 |
| 5,185,859 | 2/1993 | Guttag et al. | 395/164 |
| 5,235,543 | 8/1993 | Rosen | 395/154 |
| 5,276,800 | 1/1994 | Wada | 395/162 |

*Primary Examiner*—Alyssa H. Bowler
*Assistant Examiner*—Dzung C. Nguyen
*Attorney, Agent, or Firm*—Brian J. Wieghaus

[57] ABSTRACT

In a computer system, especially a microcontroller, a circuit for protecting hardware-modifiable status bits during a read-modify-write operation, which circuit is relatively simple to implement yet operates well and does not require an undue amount of die real estate to implement. The circuit comprises means for storing information representing whether a hardware-modifiable status bit has been updated during a read-modifying-write operation, and means to prevent overwriting of the status bit during the write portion of the read-modify-write cycle when the stored information is detected. The means for storing the information comprises a latch set into its first state whose output indicates whether the first state exists. That output is connected to logic circuitry which blocks the rewrite portion of the read-modify-write operation from changing a hardware-modified bit set during that cycle.

8 Claims, 4 Drawing Sheets

SYSTEM FOR WRITE PROTECTING A BIT THAT IS HARDWARE MODIFIED DURING A READ-MODIFY-WRITE CYCLE

This invention relates to computers, and in particular to computer circuitry for protecting the status of hardware during a read-modify-write operation.

BACKGROUND OF THE INVENTION

Many computers use read-modify-write cycles for certain purposes, especially microcontrollers (μC). A common application is to implement a bit instruction, for example, to clear or set a bit stored in a register or port. To implement this capability, a series of instructions are provided that will read, say, a port and will also read the value stored in a latch, possibly change it, and then rewrite it to the latch. These instructions can, for example, read a port byte, all 8 bits, modify only one addressed bit, and then write the new byte back to the latch.

Many popular μCs employ an interrupt system in control applications typically to, for example, toggle a port pin, or reload a timer, or read data presented at a port by a peripheral data-collecting hardware device. This interrupt system typically operates by the peripheral device or internal timer (herein referred to as "hardware" or "peripheral unit") setting a bit to serve as a flag in a register dedicated to that purpose. The term "register" is used in the widest sense to mean any kind of device capable of storing a bit, including memory locations dedicated to register functions as well as flip-flops (FF), which are commonly used as latches to store a one bit message. The CPU part of the μC will poll these registers and upon finding a set bit that indicates that certain hardware needs attention, will then stop its normal processing and branch to an interrupt service routine especially designed to handle that particular hardware. When such a flag is set representing an interrupt, it is important for the μC to service that interrupt; therefore it is important that the state of the register containing an interrupt flag is not changed until the interrupt is processed. In general, the problem exists with any register storing a status bit that represents the status of hardware, internal or external, and that must not be changed until the computer is able to take an appropriate action.

However, as noted above, when a read-modify-write operation is executed, one of its functions is to read certain latches, modify a bit stored in the latch, and rewrite it to the latch. Thus, if during a read-modify-write cycle, hardware happens to modify a bit to, say, a "1" in its latch, the read-modify-write cycle might read the bit, clear it, and write back a "0" to the latch before the CPU has had an opportunity to read the set bit and enter a service routine, since the CPU while it is executing the read-modify-write instructions cannot poll the registers for interrupts.

In certain popular μCs the solution to this problem of protecting hardware-modifiable status bits involves the provision of complex clock phases with register updates restricted to particular clock phases to avoid conflicts. Other suggested schemes involved the use of a shadow register to store the modified data and then to use the stored contents to update the register after the write-back phase of the read-modify-write cycle is completed. But this solution requires an undue increase in chip die area for the additional circuitry needed to implement this solution.

SUMMARY OF THE INVENTION

An object of the invention is improved circuitry for protecting hardware-modifiable status bits during a read-modify-write cycle.

Another object of the invention is a circuit for protecting hardware-modifiable status bits during a read-modify-write cycle, which circuit is relatively simple to implement yet operates well and does not require an undue amount of die real estate to implement.

In accordance with one aspect of the present invention, the improved circuit comprises means for storing information representing whether a hardware-modifiable status bit has been updated during a read-modify-write cycle, and means to prevent over-writing of the status bit during the write portion of the read-modify-write cycle when the stored information is detected.

In a preferred embodiment in accordance with the invention, the means for storing the information comprises a latch set into its first state whose output indicates whether the first state exists. That output is connected to logic circuitry which blocks the rewrite portion of the read-modify-write cycle from changing a hardware-modified bit set during that cycle.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals denoting the same or similar components.

DETAILED DESCRIPTION OF THE PREFERRED EMBODIMENTS

The invention is generally useful in all kinds of computers but is particularly useful in microcomputers and especially single chip microcontrollers (μC) because of the limited pin count and limited on-chip memory. The invention will be described in connection with such a μC but it is to be understood that the invention is not so limited.

Figure 1:
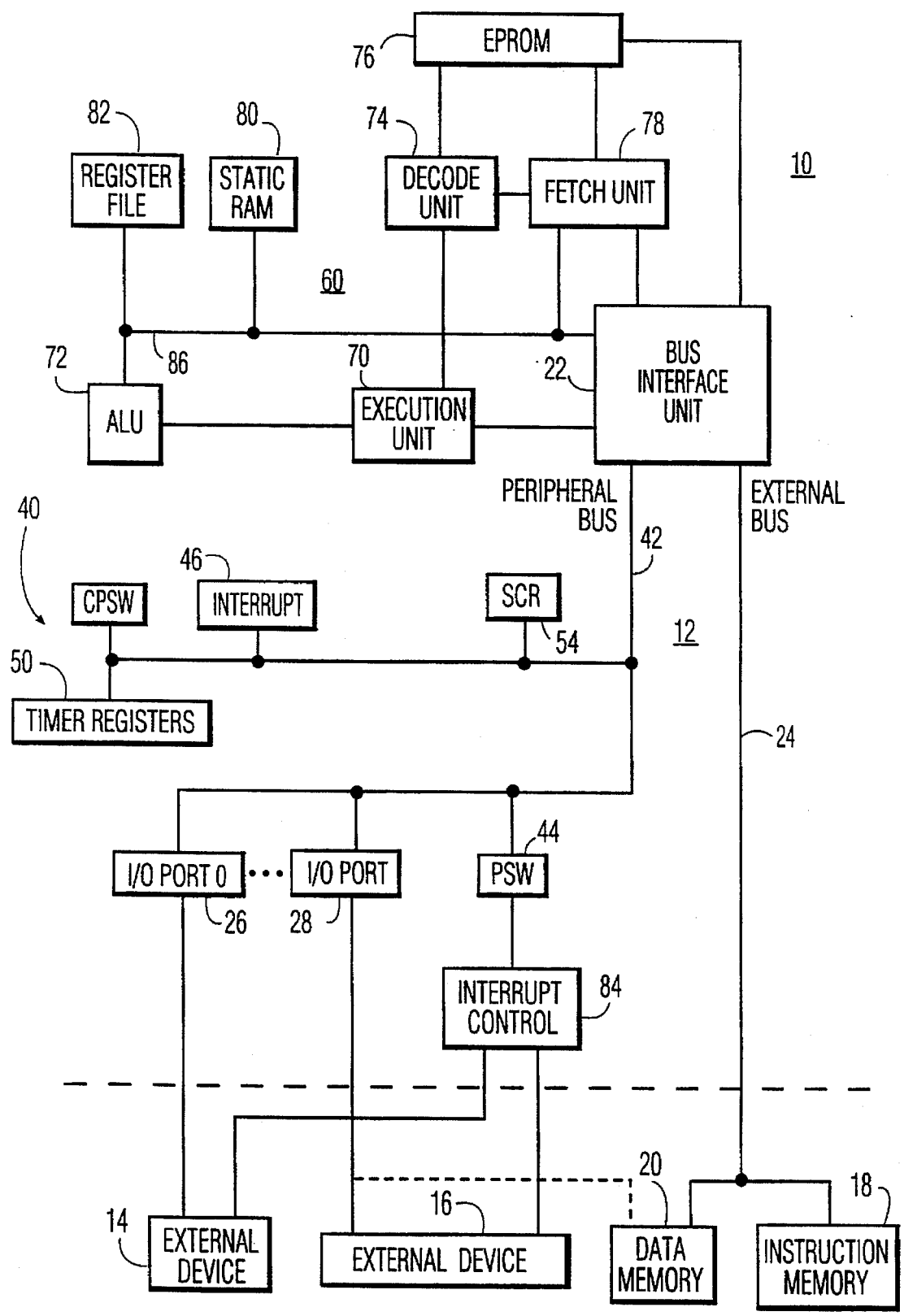
FIG. 1 is a schematic block diagram of the architecture of one form of a microcontroller in accordance with the invention.

FIG. 1 shows a schematic block diagram of a one-chip μC system 10. The system 10 includes a single chip microcontroller 12 that performs 16 bit arithmetic operations and includes internal instruction and data storage. The microcontroller 12 supports external peripheral devices 14 and 16 and, through 24 bit external address capability, supports sixteen megabytes of external instruction storage 18 and sixteen megabytes of external data storage 20. The microcontroller 12 includes a bus interface unit 22 which communicates with the external memories 18 and 20 over an external bi-directional address and data bus 24. The microcontroller 12 communicates with the external devices 14 and 16 through I/O ports 26–28 which are addressable as special function registers (SFR) 40. The ports 26–28 as well as other special function registers are addressable over an internal peripheral bus 42 through the bus interface unit 22. The data memory 20 can also be accessed as off-chip memory-mapped I/O through the I/O ports 26–28 which access is illustrated by the dashed line. The on-chip special function registers 40 also include a program status word (PSW) register 44 coupled to an interruption control unit 84 communicating with the external devices, an interrupt register 44, timer registers 50, a compatibility PSW register 52 used during operations where the microcontroller 12 is emulating other microcontrollers, a system configuration register (SCR) 54 containing system configuration bits, and others (not shown) not necessary to an understanding of the present invention. The bus interface unit 22 isolates the bit addressable peripheral special function registers 40 from the microcontroller core 60. The core 60 includes a microcode programmable execution unit 70 which controls execution of instructions by an ALU 72 and the other units. The instructions decoded by a decode unit 74 are fetched from an internal EPROM memory 76 or from the external instruction memory 18 by an instruction fetch unit 78 which contains the usual program counter which contains the address of the next instruction to be executed and the usual queue for storing prefetched instructions. Static RAM 80 as well as general purpose registers of a register file 82 are also available for instruction and data storage. The dashed line 11 separates the on-chip units (above the line 11) from the devices external to the chip.

Memory in the system 10 is addressed in units of bytes, each byte consisting of 8-bits. A word is a 16-bit value, consisting of two contiguous bytes. The storage order for data in the microcontroller 12 is "Little Endian" such that the lower byte of a word is stored at the lower address and the higher byte is stored at the next higher address. Word values are stored in RAM, registers, and word addressable SFRs with the least significant byte at the even address (the address that is specific in the code or in the pointer register) and the most significant byte at the next consecutive odd address (one greater than the address of LSB). All 16-bit word addressable locations could be accessed as both bytes and words. It is therefore possible, for example, to increment only the low-order half, or to modify only the high-order byte of a word in data memory, by making appropriate references to their memory-mapped addresses. The external bus 24 can be configured in 8 or 16-bit mode, selected during chip reset. Depending on the mode of operation selected, all 16-bit external data accesses could be strictly words (16-bit mode) or bytes from consecutive memory locations (8-bit mode). An external word fetch in 8-bit mode results in 2 separate byte accesses (the result is the same in a single word access if the data is on-chip). The microcontroller 12 performs all arithmetic internally as either an 8 or 16-bit calculation depending on the type of instruction. A byte or word operation is determined by the data size field (DS) in the instruction opcode.

On-chip peripherals and core registers that do not map to the register file are accessed by programs through the peripheral bus 42 using SFR addressing. A special problem can arise when the core 60 executes an instruction that performs a read-modify-write operation on a peripheral SFR. Read-modify-write operations include all set, clear, and write bit operations as well as instructions that perform operations on SFRs. When the SFR is a control register in a peripheral that contains a bit or bits that may be updated by the peripheral itself, such as the interrupt flag bits, the update must be held until the read-modify-write operation has completed. Otherwise the flag may be updated and then immediately over-written by the completion of a read-modify-write.

In accordance with the invention, a holding latch for any such bits is provided, in combination with a communication arrangement between the core and the device to indicate when peripheral updates must be locked out.

Figure 2:
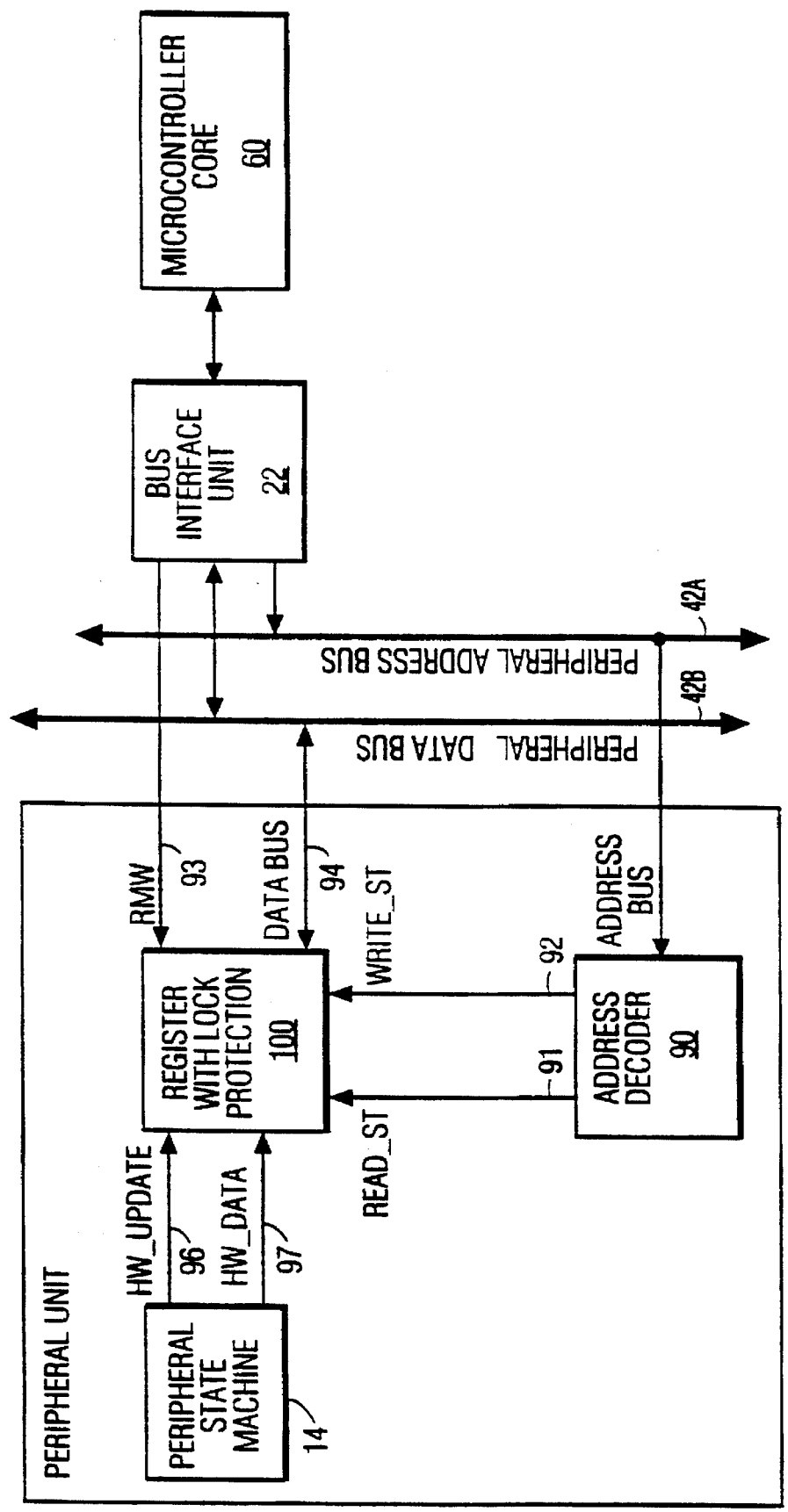
FIG. 2 is a schematic block diagram of one form of protection circuit of hardware status during a read-modify-write cycle in accordance with the invention.

FIG. 2 illustrates the basic system with the μC core 60 which communicates, bi-directionally, with the bus interface unit 22 which supplies addresses to the address bus part 42A of the bus 42, and communicates, bi-directionally, data with the data bus part 42B of the bus 42. The μC components functioning with the peripheral unit 14 include an address decoder 90 which generates READ_ST and WRITE_ST strobe control signals for the addressed peripheral unit 14 as shown at 91 and 92 to a register 100 with lock protection which also receives from the bus interface unit 22 a RMW control signal 93 and data via a bus 94, as well as a HW_UPDATE control signal 96 and HW_DATA 97 from the peripheral unit 14.

Figure 3:
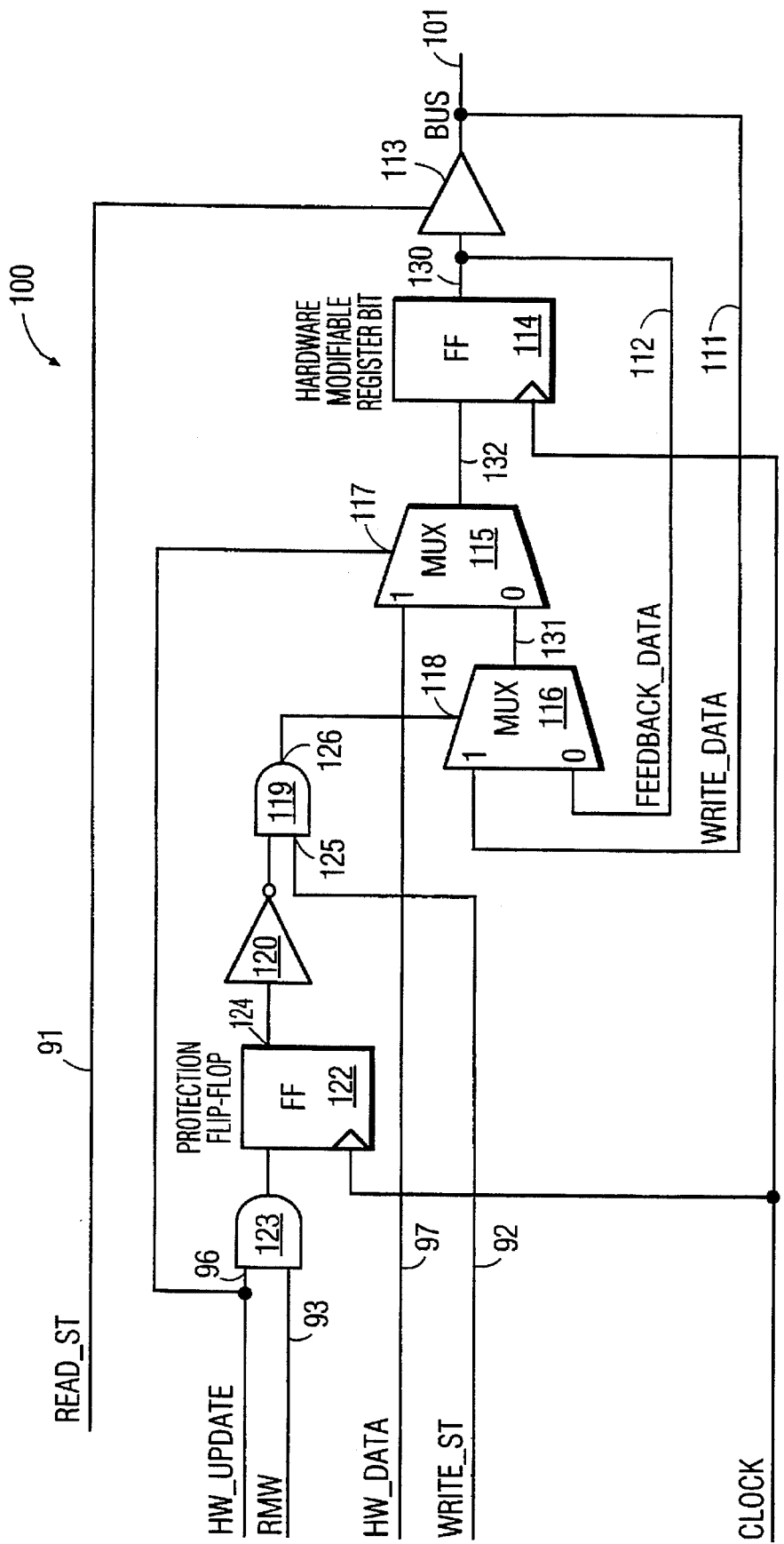
FIG. 3 is a schematic of one form of protection circuit for use in the block diagram of FIG. 3.

FIG. 3 illustrates one circuit 100 in accordance with the invention for performing the functions of preserving the HW_DATA during a read-modify-write operation. A holding latch comprising a flip-flop 114 is provided whose output 130 is connected via a controllable amplifier 113 to the internal data bus 101 leading to the μC core 60. The bus 101 also provides via a feedback loop 111 a WRITE_DATA input to the "1" input of a first multiplexer 116 (MUX), which allows bus data to be written to the FF 114 representing the register when the WRITE_ST signal is active. The second "0" input to the first multiplexer 116 is provided via a feedback loop 112 from the output 130 of the flip-flop 114. The output 131 of the first multiplexer 116 is connected to the "0" input of a second multiplexer 115 whose output 132 is connected to the flip-flop 114. A second input to the second "1" input of the multiplexer 115 is the status from the hardware 14 involved which is to be preserved during the read-modify-write operation, identified as HW_DATA. The hardware 14 can correspond to either one of the external devices 14, 16 in FIG. 1.

A protection flip-flop 122 is provided whose output 124 is connected to a first input of an AND gate 119 via an inverter 120. The second input 125 to the gate 119 is a write strobe (WRITE_ST) control signal from the decoder 90. A second AND gate 123 has its output connected as an input to the protection flip-flop 122, and has a first input 93 connected to receive a read-modify-write (RMW) control signal from the bus interface unit 22 and a second input 96 connected to receive a strobe signal (HW_UPDATE) to load the hardware data (HW_DATA) into the flip-flop 114. The second input 96 is also connected as a strobe control signal to the second multiplexer 115 at the control input 117. A read strobe control signal (READ_ST) from the decoder 90 is also applied 91 as a control signal to the amplifier 113.

The circuit operates as follows. Under normal operation, when the hardware generates a status bit (HW_DATA), which is applied to the "1" input of the second multiplexer 115, the peripheral unit 14 will generate a hardware update control signal (HW_UPDATE). The latter when applied to the control input 117 of the multiplexer 115 passes the data (usually a "1") to the FF 114 which is set into its "1" state indicating that that hardware 141 needs CPU attention. At any time, for example during a normal poll operation, a read status (READ_ST) control signal from the CPU will cause the amplifier 113 to output on the bus 101 the state of the FF 114. The feedback loop 112 serves to maintain the state of the FF 114 during each clock cycle by feeding back the current state, FEEDBACK_DATA, to the "0" input of the first multiplexer 116 which in turn outputs via line 131 to the "0" input of the second multiplexer 117 the same state which is passed on to the FF 114 when its control input 117 is strobed by HW_UPDATE.

Whenever the bus interface unit 22 deasserts the read-modify-write (RMW) control signal for the bus, each of the protection FFs 122 for each latch holding a hardware status bit will be cleared. When the bus control logic asserts the read-modify-write (RMW) control signal, the protection FFs 122 will remain deasserted until a hardware update occurs to the FFs corresponding bit in the FF 114. At this point, the FF 114 will be set to indicate that the bit has been updated and must not be overwritten by the write-back portion of the read-modify-write operation on the bus.

When the write-back occurs at the end of the read-modify-write operation, any register bits which have their protection FF 122 set will retain their value and ignore the value being written to them via the bus. Any latch whose protection FF is not set, or any bit which is not modifiable by the hardware, will accept the bus write data as normal.

Figure 4:
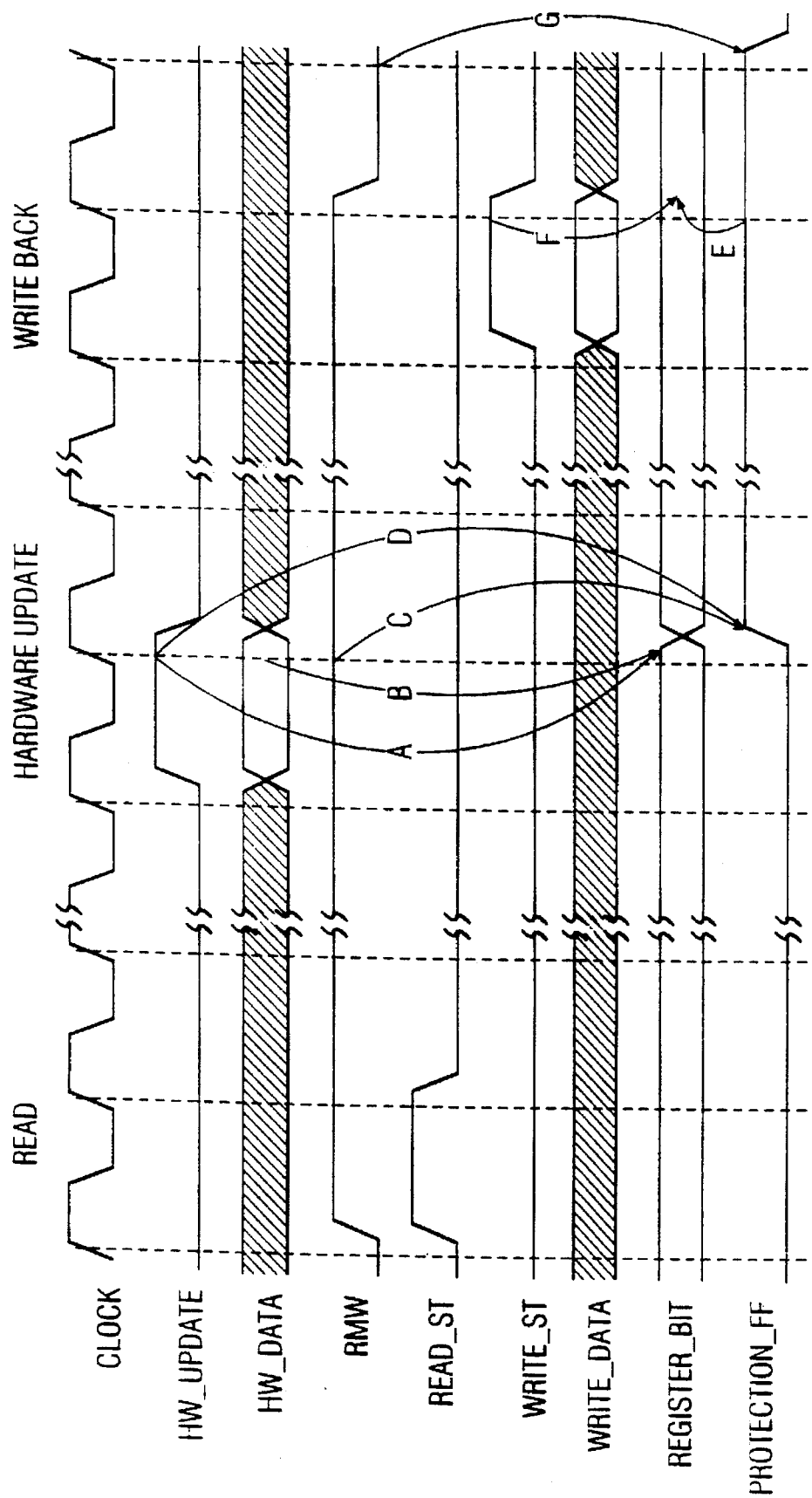
FIG. 4 shows the waveforms of the control and data signals during a read-modify-write operation in a system in accordance with the invention.

This operation requires that the bus control logic assert the read-modify-write (RMW) control signal during the read portion of the operation and keep it asserted until the write-back is completed. FIG. 4 shows the signal waveforms during the read-modify-write operation. All control signals shown are active when high and inactive when low. The signal names shown are indicated in FIG. 3, except that REGISTER_BIT represents the data stored in the FF 114, and PROTECTION_FF represents the state of the protection FF 122. The cycle phases are indicated by the labels at the top. The transitions indicated by the letters A and B indicate that, when the HW_UPDATE strobe is active, the REGISTER_BIT is, loaded with the HW_DATA. The transitions indicated by the letters C and D indicate that, when the HW_UPDATE strobe is active and the RMW signal is active, the PROTECTION_FF is set. The transitions indicated by the letters E and F indicate that, when the PROTECTION_FF is set, the WRITE_ST is ignored and the REGISTER_BIT is not loaded with the WRITE_DATA. The transition indicated by the letter G indicates that, when the RMW signal is deasserted, the PROTECTION_FF is reset.

It will be understood that, while the logic circuit used to illustrate the invention is preferred, other logic circuits capable of performing the functions indicated above to preserve the status of a register bit modified during a read-modify-write operation will be evident to those skilled in this art and are intended to be included within the scope of this invention.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. In a computer system having a first register comprising first means for storing a hardware-modifiable bit, said first means being connected to a bus, and second means connected to the bus for executing a read-modify-write operation by generating a read-modify-write signal, the improvement comprising:

(a) third means for selectively preventing overwriting of said first means during a read-modify-write operation if said stored hardware-modifiable bit has been updated by a hardware during the read-modify-write operation, said third means comprising:

(i) fourth means for storing a first state indicating whether said stored hardware-modifiable bit has been updated by said hardware during the read-modify-write operation, (ii) fifth means, connected to the bus and said first means and having a control input connected to the fourth means, for selectively allowing a write portion of the read-modify-write operation to overwrite the first means when the fourth means is not in its first state and for selectively preventing the write portion of the read-modify-write operation from overwriting the first means when the fourth means is in its first state.

2. In a computer system having a first register comprising first means to store a hardware-modifiable bit in response to a hardware-update signal, said first means being connected to a bus, and second means for executing a read-modify-write operation by generating a read-modify-write signal, the improvement comprising:

(a) third means for selectively preventing overwriting of said first means during a read-modify-write operation if said stored hardware-modifiable bit has been updated by a hardware during the read-modify-write operation, said third means comprising:

(i) a protection flip-flop for storing a first state indicating whether said stored hardware-modifiable bit has been updated by said hardware during the read-modify-write operation, said protection flip-flop having an output, (ii) a first switch connected between the bus and said first means and having a first switch control input, (iii) first gating means connected between the protection flip-flop output and the first switch control input and having an input connected to receive a write control signal, said first gating means in response to a write control signal and an output from the protection flip-flop indicating it is not in its first state producing an output to the first switch control input which is operable to allow a write portion of the read-modify-write operation to overwrite the first means, said first gating means in response to a write control signal and an output from the protection flip-flop indicating it is in its first state producing an output to the first switch control input which is adapted to prevent a write portion of the read-modify-write operation from overwriting the first means.

3. The system of claim 2, wherein the first switch comprises a first MUX.

4. The system of claim 3, further comprising a second MUX connected to an output of the first MUX and having an output connected to the first means.

5. The system of claim 4, further comprising a control amplifier connected to an output of the first means and having a control input connected to receive a read control signal.

6. The system of claim 5, further comprising an inverter and a first AND gate connected in series between the output of the protection flip-flop and a control input of the first MUX.

7. The system of claim 6, further comprising a second AND gate whose output is connected to the protection flip-flop and having inputs connected to receive a hardware update control signal and the read-modify-write control signal.

8. The system of claim 7, further comprising a first feedback loop from the first means to the first MUX to maintain the stored bit, and a second feedback loop connected between the bus and the first MUX.

* * * * *